(12) United States Patent
Chou et al.

(10) Patent No.: US 8,683,276 B2
(45) Date of Patent: Mar. 25, 2014

(54) APPARATUS AND METHOD FOR REPAIRING AN INTEGRATED CIRCUIT

(75) Inventors: Yung-Fa Chou, Kaohsiung (TW); Ding-Ming Kwai, Zhubei (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 205 days.

(21) Appl. No.: 13/397,567

(22) Filed: Feb. 15, 2012

(65) Prior Publication Data
US 2013/0210170 A1 Aug. 15, 2013

(51) Int. Cl.
*G11C 29/00* (2006.01)
*G11C 7/00* (2006.01)

(52) U.S. Cl.
USPC ........... 714/710; 714/718; 714/723; 365/200; 365/201

(58) Field of Classification Search
USPC ......... 714/710, 711, 718, 719, 723, 733, 734, 714/6.1, 6.13, 6.2, 6.3, 6.31, 6.32; 365/200, 365/201
See application file for complete search history.

(56) References Cited

U.S. PATENT DOCUMENTS

| | | | |
|---|---|---|---|
| 5,383,156 A | 1/1995 | Komatsu | |
| 6,111,798 A | 8/2000 | Lee | |
| 6,118,712 A | 9/2000 | Park et al. | |
| 6,154,851 A | 11/2000 | Sher et al. | |
| 7,312,109 B2 | 12/2007 | Madurawe | |
| 7,336,549 B2 | 2/2008 | Min et al. | |
| 7,495,977 B1 * | 2/2009 | Moscaluk | 365/200 |
| 7,606,102 B2 | 10/2009 | Blodgett | |
| 7,848,164 B2 | 12/2010 | Sohn | |
| 8,116,156 B2 * | 2/2012 | Riho et al. | 365/200 |
| 8,190,950 B2 * | 5/2012 | Chen et al. | 714/711 |
| 8,499,207 B2 * | 7/2013 | Mohr et al. | 714/710 |
| 2011/0013469 A1 | 1/2011 | Park et al. | |

FOREIGN PATENT DOCUMENTS

| | | |
|---|---|---|
| CN | 101499320 | 8/2009 |
| TW | I326453 | 6/2010 |
| TW | I342567 | 5/2011 |

OTHER PUBLICATIONS

Chang et al., "A Built-In Redundancy-Analysis Scheme for RAMs With 3D Redundancy," in IEEE Proc. VLSI-DAT, 2011, pp. 264-267.
Chou et al., "Yield Enhancement by Bad-Die Recycling and Stacking With Though-Silicon Vias," IEEE Transactions on Very Large Scale Integration (VLSI) Systems, vol. 19, No. 8, Aug. 2011.
Chou et al., "Yield Enhancement Techniques for 3D Random Access Memories," in IEEE Proc VLSI-DAT, 2010, pp. 104-107.
Horiguchi, "Redundancy Techniques for High-Density DRAMS," 1996 Innovative Systems in Silicon Conference, IEEE 0-7803-4275-5/97 (1997), pp. 22-29.

* cited by examiner

*Primary Examiner* — Christine Tu
(74) *Attorney, Agent, or Firm* — Finnegan, Henderson, Farabow, Garrett & Dunner, LLP

(57) ABSTRACT

A method for repairing an integrated circuit comprises: fabricating a first circuit, the first circuit including a plurality of regular units and a plurality of redundant units, each of the regular units being identified by an address; performing a first test on the first circuit to determine if a defective regular unit is present; activating, if the defective regular unit is present, at least a first redundant unit to replace the defective regular unit, the first redundant unit being identified by an address of the defective regular unit; performing, if the at least first redundant unit is present, a second test on the first circuit to determine if the first redundant unit is defective; and activating at least a second redundant unit to replace the defective first redundant unit, the second redundant unit being identified by the address of the defective regular unit.

26 Claims, 10 Drawing Sheets

APPARATUS AND METHOD FOR REPAIRING AN INTEGRATED CIRCUIT

TECHNICAL FIELD

This disclosure relates to apparatus and method for repairing circuit components in an integrated circuit.

BACKGROUND

Modern integrated circuits often contain redundant components to provide a failover mechanism. Such a mechanism provides that, when a regular component fails, a redundant component is activated to replace the regular component.

For example, when an integrated memory circuit is manufactured, a group of redundant cells are disposed within the circuit. If a memory cell is defective as a result of a manufacturing process or fails after the circuit is fabricated, the defective/failed memory cell may be replaced by a redundant component. This may be done, for example, by transferring the address of the defective/failed cell to the redundant component.

SUMMARY

According to a first aspect of the present disclosure, a method is provided for repairing an integrated circuit, comprising: fabricating a first circuit, the first circuit including a plurality of regular units and a plurality of redundant units, each of the regular units being identified by an address; performing a first test on the first circuit to determine if a defective regular unit is present; activating, if the defective regular unit is present, at least a first redundant unit to replace the defective regular unit, the first redundant unit being identified by an address of the defective regular unit; performing, if the at least first redundant unit is present, a second test on the first circuit to determine if the first redundant unit is defective; and activating at least a second redundant unit to replace the defective first redundant unit, the second redundant unit being identified by the address of the defective regular unit.

According to a second aspect of the present disclosure, an apparatus is provided for repairing an integrated circuit, comprising: a plurality of redundant control circuits, each redundant control circuit being associated with a redundant unit. Each redundant control circuit includes: a receiving device configured to receive an external control signal; a fuse element configured to indicate whether the redundant unit associated with the redundant unit controller is available to replace another redundant unit that was previously activated to repair the integrated circuit; and a redundant controller configured to select and activate the associated redundant unit in response to the external control signal to replace the previously activated redundant unit, if the associated redundant unit is available to replace the previously activated redundant unit.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the present disclosure and, together with the description, serve to explain the principles of the invention.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems and methods consistent with aspects related to the invention as recited in the appended claims.

Figure 1:
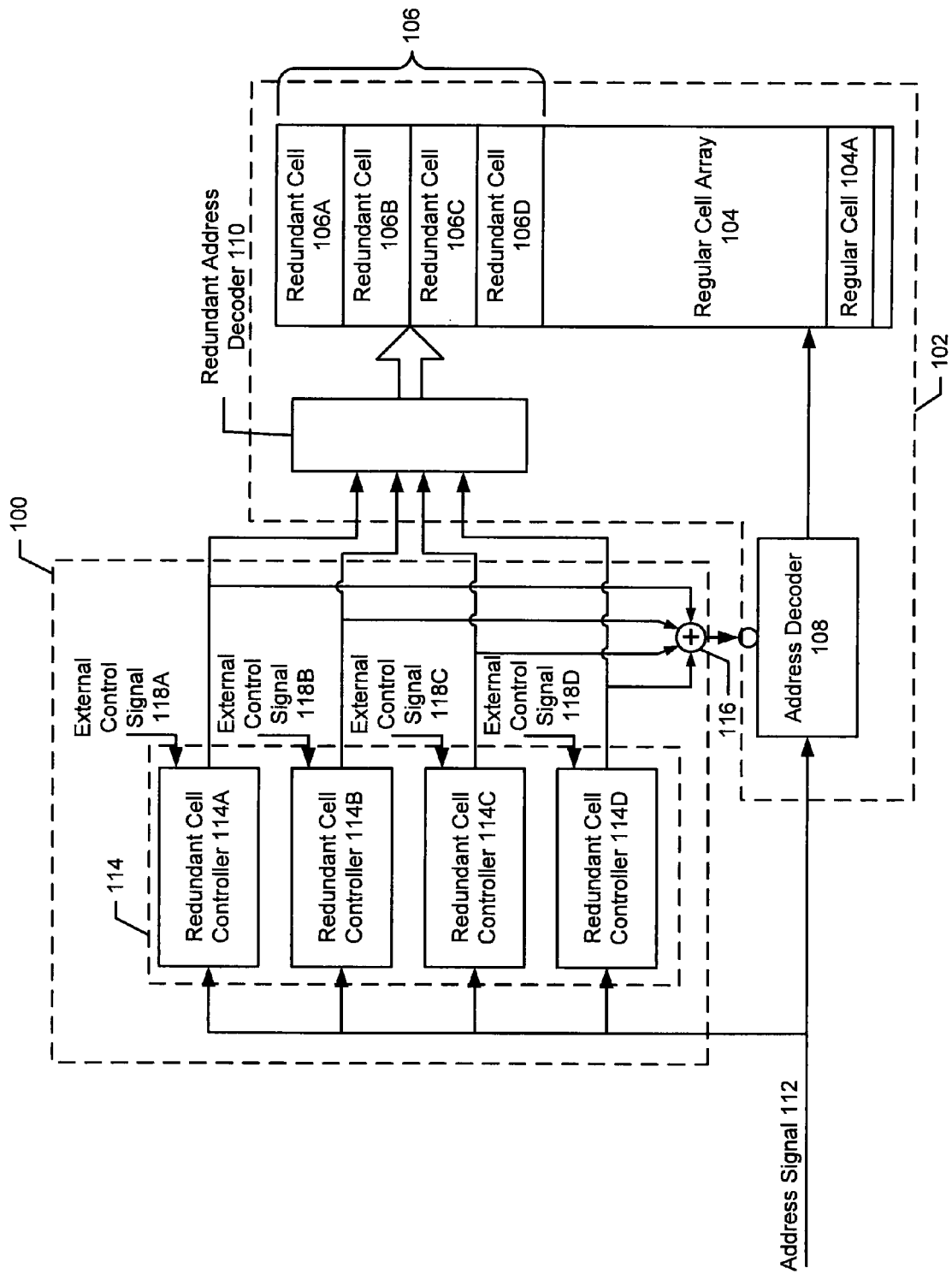
FIG. 1 illustrates a block diagram of a circuit for repairing an integrated circuit including a one-dimensional cell array, according to an embodiment.

FIG. 1 illustrates a block diagram of a redundant control circuit 100 for repairing an integrated circuit 102. For illustrative purposes and without limitation, integrated circuit 102 may be a conventional memory circuit. Integrated circuit 102 includes a regular cell array 104 including a plurality of cells, a plurality of redundant cells 106, an address decoder 108, and a redundant address decoder 110. Each cell in array 104 is assigned an address and can be individually selected and accessed by address decoder 108 according to an address signal. 112.

Cell array 104 may be provided as a memory array in which the memory cells can be individually addressed by address decoder 108. Address signal 112 carries address data, which is decoded by address decoder 108 to identify the associated cell within array 104. Redundant cells 106 include redundant memory cells 106A-106D, which can be individually addressed by redundant address decoder 110 according to output signals from redundant control circuit 100. Integrated circuit 102 may comprises greater or fewer redundant cells.

As further depicted in FIG. 1, redundant control circuit 100 includes a plurality of redundant cell controllers 114 for controlling redundant cells 106A-106D through redundant address decoder 110. Redundant control circuit 100 further includes a logic OR operator 116 for disabling or enabling address decoder 108 in response to output signals from redundant cell controllers 114.

As shown in FIG. 1, output signals of individual redundant cell controllers 114A-114D are input to redundant address decoder 110, which decodes the output signals and selects one of redundant cells 106 based on the decoded data. The output signals of redundant cell controllers 114A-114D are also processed by logic OR operator 116. Based on the output signals from redundant cell controllers 114A-114D, logic OR operator 116 may enable or disable address decoder 108. Logic OR operator 116 generates a high voltage, i.e., a logic "1," on the output line when any one of the output signals from redundant cell controller 114A-114D has a high voltage, i.e., a logic "1." In addition, logic OR operator 116 generates a low voltage, i.e., a logic "0," on the output line when all output signals from redundant cell controller 114A-114D have a low voltage, i.e., a logic "0." Redundant cell controllers 114A-114D in FIG. 1 are depicted for illustrative purposes. Redundant control circuit 100 may include greater or fewer redundant cell controllers 114.

According to a further embodiment, redundant cell controllers 114 may be controlled by external control signals 118, including signals 118A-118D. External control signals 118A-118D may be received from an external control circuit to disable or enable individual redundant cell controllers 114A-114D, respectively. In addition, redundant cell controllers 114 may receive address signal 112, which is also input to address decoder 108. When enabled by one of external control signals 118, e.g., external control signal 118A, a corresponding one of redundant cell controller, e.g., 114A, compares the address data carried in address signal 112 with a pre-stored address and generates an output indicative of a comparison result. For example, if the received address data matches the address stored therein, the redundant cell controller 114A outputs a high voltage, e.g., a logic "1". If, on the other hand, the received address data does not match the pre-stored address, redundant cell controller 114A outputs a low voltage, a logic "0". In addition, when disabled by the external control signal, e.g., external control signal 118A, redundant cell controller 114A outputs a low voltage, e.g., the logic "0." The external control circuit for generating external control signals 118A-118B will be further described below.

Integrated circuit 102 and redundant control circuit 100 may be disposed in a single die or in separate dice. During fabrication or subsequent operations of integrated circuit 102, individual cells in regular cell array 104 may become defective. According to an embodiment, when detecting a defective cell in array 104, redundant control circuit 100, under the control of an external control circuit, may select one of redundant cells 106 to replace the defective cell in array 104. For example, when cell 104A in array 104 is defective, redundant cell controller 114A may be configured or activated by the external control circuit to select a redundant cell to replace defective cell 104A. Specifically, the external control circuit first inputs and stores the address of defective cell 104A in redundant cell controller 114A. The external control circuit then sets external control signal 118A to enable redundant cell controller 114A, for example, by switching external control signal 118A from a low voltage, e.g., a logic "0," to a high voltage, e.g., a logic "1." The external control circuit will be further described below.

When an external circuit attempting to access cell 104A issues address signal 112, which carries the address of the corresponding defective cell, both address decoder 108 and redundant cell controllers 114 receive the address signal. Redundant cell controller 114A first compares the address data carried in the address signal with the pre-stored address therein. If the address data matches the pre-stored address, redundant cell controller 114A generates, for example, a high voltage, i.e., a logic "1," indicating a match. On the other hand, if the address data does not match the pre-stored address, redundant cell controller 114A generates, for example, a low voltage, i.e., a logic "0." Furthermore, even if the pre-stored address does not match the address data in address signal 112, redundant cell controller 114A, under the control of external control signal 118A, can still generate a high voltage, i.e., a logic "1," indicating a forced match. The forced match will be described below.

Redundant cell controllers 114G-114D are either disabled by external control signals 118B-118D or store addresses different from the address data carried in address signal 112. As a result, redundant cell controllers 114B-114D generate a low voltage, indicating a logic "0," in response to the address signal. In response to the outputs from redundant cell controllers 114A-114D, logic OR operator 116 generates an output indicating that a match is found in at least one redundant cell controller 114. The output from logic OR operator 116 disables address decoder 108, thereby preventing address decoder 108 from accessing defective cell 104A, even though address signal 112 carries the address of cell 104A.

On the other hand, redundant address decoder 110 receives the output signals from redundant cell controllers 114A-114D and selects, for example, redundant cell 106A by decoding the output signals. Accordingly, redundant cell 106A is accessed in response to the address data in address signal 112, thereby replacing defective cell 104A. By replacing cell 104A with redundant cell 106A while retaining the address, redundant control circuit 100 allows the external circuit seeking to access cell 104A to continue using the address even after cell 104A becomes defective.

According to another embodiment, redundant control circuit 100 may also select individual redundant cells 106A-106D to replace another redundant cell, which was previously selected to replace a defective cell as discussed above. For example, if redundant cell 106A, which was previously selected to replace cell 104A, fails, redundant control circuit 100 can select another redundant cell, such as redundant cell 106B, to replace defective redundant cell 106A.

Specifically, when determining that redundant cell 106A becomes defective, the external control circuit may input and store the address of defective cell 104A, which was previously stored in redundant cell controller 114A, in redundant cell controller 114B. The external control circuit then sets external control signal 118A to disable redundant cell controller 114A by switching external control signal 118A from a high voltage, e.g., a logic "1," to a low voltage, e.g., a logic "0." Furthermore, the external control circuit sets external control signal 118B to enable redundant cell controller 114B, for example, by switching external control signal 118B from a low voltage, e.g., a logic "0," to a high voltage, e.g., a logic "1."

When address decoder 108 and redundant cell controllers 114 receive address signal 112 from an external circuit seeking to access cell 104A, redundant cell controller 114B compares the address data carried in the address signal with the pre-stored address therein. Upon determining a match, redundant cell controller 114B generates an output signal having a high voltage, i.e., a logic "1," which indicates a match. Since redundant cell controller 114A is disabled by external controller signal 118A, the output of redundant cell controller 114A maintains a low voltage, i.e., a logic "0." Redundant cell controllers 114C and 114D also generate low-voltage outputs, because they are either disabled or store a different address.

Logic OR operator 116 receives the output signals from redundant cell controllers 114A-114D and generates an output, which disables address decoder 108. The disabled address decoder 108 prevents the external circuit from accessing defective cell 104A. Furthermore, redundant address decoder 110 decodes the output signals from redundant cell controllers 114A-114D and selects redundant cell 106B, accordingly. As a result, redundant control circuit 100 allows the external circuit to continue using the same address even after the failure of both cell 104A and redundant cell 106A.

One skilled in the art will now appreciate that the high and low voltages described above represent logical high and low and may be represented by appropriate voltage levels known in the art. In addition, the logic high and low may be interchanged, while the same logic is maintained within the system. For example, the low-voltage output may indicate a match between the received address data and the pre-stored address, and the high-voltage output may indicate a mismatch. Accordingly, address decoder 108 may be disabled by a low voltage rather than a high voltage.

Figure 2:
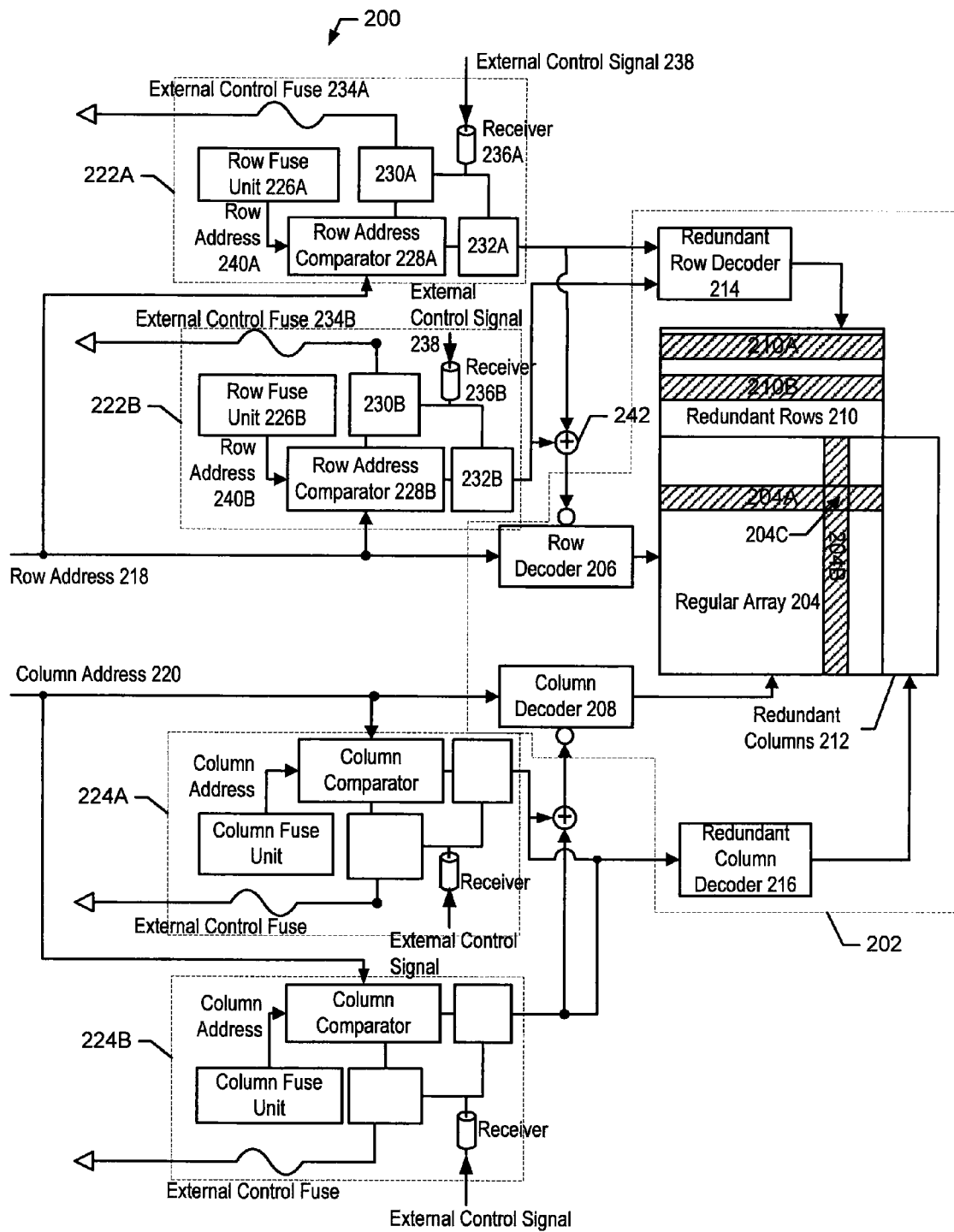
FIG. 2 illustrates a block diagram of a circuit for repairing an integrated circuit including a two-dimensional cell array, according to an embodiment.

FIG. 2 illustrates a block diagram of a redundant control circuit 200 for repairing an integrated circuit 202 according to another embodiment. In particular, integrated circuit 202 comprises a two-dimensional cell array 204, which includes a plurality of circuit cells 204C. Each cell 204C is identified by a row 204A and a column 204B. Row 204A and column 204B are identified by a row address and a column address, respectively. In addition, integrated circuit 202 includes a row decoder 206, a column decoder 208, a plurality of redundant rows 210, a plurality of redundant columns 212, a redundant row decoder 214, and a redundant column decoder 216. The structure and operation of the circuit components of integrated circuit 202 are known in the art.

In general, an external circuit may access a particular cell, e.g., 204C, in cell array 204 by issuing a row address signal 218 to row decoder 206 and a column address signal 220 to column decoder 208. Row decoder 206 and column decoder 208 decode the address signals and select cell 204C based on the decoded row address and column address.

According to one embodiment, when a cell in cell array 204 becomes defective, redundant control circuit 200 may select a redundant row 210 or a redundant column 212 to replace the row or the column in which the defective cell is located. In particular; redundant control circuit 200 includes a plurality of redundant row controllers 222A and 222B and a plurality of redundant column controllers 224A and 224B. Since the redundant row controllers and the redundant column controllers have similar structures and functions, only the redundant row controllers are described herein.

Each redundant row controller 222A or 222B includes a row fuse unit 226A or 226B, a row address comparator 228A or 228B, an external fuse control circuit 230A or 230B, a redundant row control unit 232A or 232B, and an external control fuse 234A or 234B. Each redundant row controller 222A or 222B further includes a receiving device 236A or 236B for receiving an external control signal 238 to control external fuse control circuit 230A or 230B and redundant row control unit 232A or 232B. Alternatively, redundant row controllers 222A and 222B may share one receiving device and may receive external control signal 238 through the shared receiving device.

Each row fuse unit, e.g., 226A, includes a fuse circuit, which may be configured to store a row address, e.g., 240A, and provides the stored address to the row comparator, e.g., comparator 228A. Row comparator 228A receives row address signal 218, which carries address data, and compares it with pre-stored address 240A provided by row fuse unit 226A. Row comparator 228A generates an output signal indicating whether the received row address data in row address signal 218 matches pre-stored row address 240A.

External fuse control circuit, e.g., 230A, enables or disables row comparator 228A, depending on the status of external control fuse 234A and external control signal 238. For example, when external control fuse 234A is connected, external fuse control circuit 230A enables row comparator 228A, if external control signal 238 is set to logic "0," and disables row comparator 228A if external control signal 238 is set to logic "1."

When external control fuse 234A is disconnected, the control logic is reversed. Specifically, external fuse control circuit 230A enables row comparator 228A, if external control signal 238 is set to logic "1," and disables row comparator 228A, if external control signal 238 is set to logic "0."

In addition, external control signal 238 further controls redundant row control unit 232A to pass through or block output signals from row address comparator 228A. When redundant row control unit 232A is enabled by external control signal 238, it passes through the output signals from row address comparator 228A to redundant row decoder 214. When redundant row control unit 232A is disabled by external control signal 238, it blocks the output signals from row address comparator 228A. The operation of redundant cell controller 222B is similar.

According to a further embodiment, when cell 204C in array 204 becomes defective, redundant control circuit 200 selects a redundant row, e.g., 210A, to replace defective regular row 204A, in which defective cell 204C is located. Alternatively, redundant control circuit 200 may select a redundant column to replace defective regular column 204B, in which defective cell 204C is located.

In order to replace defective regular row 204A with redundant row 210A, an external testing system inputs and stores the row address of defective row 204A in row fuse unit 226A. For example, the external testing system may be a known testing system for testing and repairing circuit cell 204. Upon detecting that regular row 204A is defective, the external testing system automatically determines the row address of row 204A and stores the row address in row fuse unit 226A by laser means, electrical means, or programming a programmable circuit device. For example, the external testing system may control a laser head to selectively blow or disconnect fuses of row fuse unit 226A according to the row address of defective row 204A. Alternatively, the external testing system may generate electrical pulses to selectively blow or disconnect the fuses of row fuse unit 226A. In addition, the external testing system does not blow or disconnect external control fuse 234A, indicating that redundant controller 222A is activated to select a redundant row. Furthermore, the external testing system blows or disconnects external control fuse 234B, also by way of laser means, electrical means, or programming a programmable circuit device, indicating that redundant controller 222B is not in use.

After row fuse unit 226A and external control fuses 234A and 234B are properly configured, an external control circuit sets external control signal 238 to a logic "1," which enables external fuse control circuit 230A and redundant row control unit 232A and disables external fuse control circuit 230B and redundant row control unit 232B.

When row address signal 218 is received from an external circuit attempting to access cell 204C, redundant row address comparator 228A compares the address data in row address signal 218 with pre-stored row address 240A in row fuse circuit 226A. If they match, redundant row address comparator 228A generates an output signal indicating a match. External control signal 238 causes redundant control unit 232A to pass through the output signal from redundant row address comparator 228A to redundant row decoder 214.

As for redundant controller 222B, because external control fuse 234B is disconnected, external control signal 238 causes external fuse control circuit 230B to disable row address comparator 228B. In addition, external control signal 238 causes redundant control unit 232B to block the output signal from row address comparator 228B. As a result, redundant control unit 232B supplies a low-voltage signal, i.e., a logic "0," to redundant row decoder 214 regardless of the data carried in row address signal 218. Redundant row decoder 214 receives outputs from redundant row controllers 222A and 222B and determines that redundant row 210A should be accessed.

In addition, the outputs from redundant control circuits 232A and 232B are supplied to logic OR operator 242, which generates a row match signal indicating a row match is found in at least one of the redundant row controllers. The row match signal disables row address decoder 206 and prevents access to defective row 204A in response to the row address signal. Thus, by replacing defective row 204A in regular array 204 with redundant row 210A, redundant control circuit 200 allows an external circuit to use the same row address to access integrated circuit 202 even after cell 204C fails.

According to another embodiment, when a redundant row, e.g., 210A, which was previously activated and used to replace a regular row, fails, redundant control circuit 200 may select an unused redundant row, e.g., 210B, to replace the defective redundant row. For example, after redundant control circuit 200 selects and activates redundant row 210A to replace defective row 204A, if redundant row 210A itself fails, redundant control circuit 200 may select and activate redundant row 210B to replace defective redundant row 210A.

In order to select an unused redundant row to replace a used redundant row, external control fuses 234A and 234B are first examined to determine the statuses of redundant row controllers 222A and 222B. As discussed above, when defective row 204A was previously selected, external control fuse 234A of redundant row controller 222A remained connected to indicate that redundant row 210A is activated to replace a defective regular row. On the other hand, external control fuse 234B of redundant row controller 222B was disconnected to indicate that redundant row 210B is unused. As a result, used and unused redundant rows are identified by checking the statuses of corresponding external control fuses 234A and 234B.

More specifically, the statuses of external control fuses 234A and 234B may be checked by examining signal on from their corresponding receivers 236A and 236B. For example, the external testing system described above may be connected to redundant control circuit 200 and receive signals from receivers 236A and 236B. Based on these signals, the external testing system can determine whether external control fuses 234A and 234B are connected or disconnected. The testing procedure will be further described below.

Upon identifying unused redundant row 210B by checking external control fuse 234B, the external testing system inputs and stores the address of defective row 204A in row fuse unit 226B. As discussed above, this may be achieved by laser means, electrical means, or programming a programmable circuit device. The external testing system then sets external control signal 238 through receivers 234A and 234B to disable redundant row address comparator 228A and enable redundant row address comparator 228B. Furthermore, external control signal 238 causes redundant control unit 232A to block the output of redundant row address comparator 228A and enables redundant control unit 232B to pass through the output of redundant row address comparator 228B. The external control circuit will be described below.

In response to external control signal 238 and disconnected external control fuse 234A, external fuse control circuit 230A and redundant control unit 232A operate together to force redundant row address comparator 228A to generate an output, e.g., a logic "0," indicating a mismatch, while the received address data matches the stored address in row fuse circuit 226A. As a result, redundant row controller 222A supplies a low-voltage output to redundant row decoder 214 regardless of the address data carried in row address signal 218.

Enabled by external fuse control circuit 230B, row address comparator 228B compares pre-stored address 240B supplied by row fuse unit 226B and the address data in row address signal 218. If they match, row address comparator 228B generates an output signal, e.g., a logic "1," indicating the match. Redundant row controller 222B passes the output signal to redundant row decoder 214.

Redundant row decoder 214 receives the output signals from redundant row controllers 222A and 222B and selects redundant row 210B accordingly. Logic OR operator 242 receives the output signals from redundant row controllers 222A and 222B and generates a row match signal indicating a row address match is found by at least one of the redundant row controller. By generating the row match signal, logic OR operator 242 disables row address decoder 206 and prevents access to defective row 204A. In addition, because redundant row controller 222A is disabled in response to external control signal 238, redundant row 210A, which was previously activated to replace defective row 204A, is not accessed. As a result, redundant control circuit 200 replaces previously activated redundant row 210A with another redundant row 210B and allows the external circuit to access integrated circuit 202 using the same row address even after the failure of both regular row 204A and redundant row 210A.

In general, the statuses of external control fuses 234A and 234B indicate whether their associated redundant rows 210A and 210B have been previously used to replace a defective row in regular circuit array 204. Specifically, a connected external control fuse indicates that the associated redundant row has been activated to replace the defective row in regular circuit array 204. As a result, the used redundant row cannot be used to replace another redundant row. A disconnected external control fuse, on the other hand, indicates that the associated redundant row has not been used and therefore can be activated to replace another redundant row.

As discussed above, a redundant control circuit similar to redundant control circuits 100 and 200 may be used to repair an integrated circuit having a one, two, or three-dimensional regular circuit array. The basic circuit unit for repairing the integrated circuit corresponds to the structure of the circuit array being repaired. For example, when the integrated circuit has a one-dimensional regular circuit array, such as cell array 104 in FIG. 1, the basic circuit units for repairing the integrated circuit are individual cells. Accordingly, when a cell becomes defective in cell array 104, the redundant control circuit selects a redundant unit, i.e., an individual redundant cell, to replace the defective cell. Similarly, when a redundant cell becomes defective, the redundant control circuit selects another redundant cell to replace the defective redundant cell.

Alternatively, when the integrated circuit has a two-dimensional circuit array, such as cell array 204 in FIG. 2, in which cells are arranged in rows and columns, the basic circuit units for repairing the integrated circuit are rows or columns. Accordingly, when a cell becomes defective in cell array 204, the redundant control circuit selects a redundant unit, i.e., a redundant row or column, to replace the defective row or column, i.e., the row or column, in which the defective cell is located. Similarly, when a cell in a redundant row or column becomes defective, the redundant control circuit selects another redundant row or column to replace the defective redundant row/column, i.e., the redundant row or column, in which the defective cell is located.

Still alternatively, the integrated circuit may have a three-dimensional circuit array, which includes a plurality of layers, each layer including circuit cells arranged in rows, and columns. Accordingly, the basic circuit units for repairing the integrated circuit may be layers. For example, the integrated circuit may include redundant layers. When a cell becomes defective in regular cell array, the redundant control circuit selects a redundant unit, i.e., a redundant layer, to replace the defective layer, i.e., the layer, in which the defective cell is located. Similarly, when a cell in a redundant layer becomes defective, the redundant control circuit selects another redundant layer to replace the defective redundant layer, the redundant layer, in which the defective cell is located.

FIGS. 3A-3C and 4A-4C illustrate a circuit diagram of a redundant controller when the external control fuse is connected and disconnected, according to some embodiments. Redundant controller 300 in FIG. 3A can be used to implement redundant controller 114A-114D in FIG. 1 or redundant row controller 222A and 222B and redundant column controller 224A and 224B in FIG. 2.

Figure 3A:
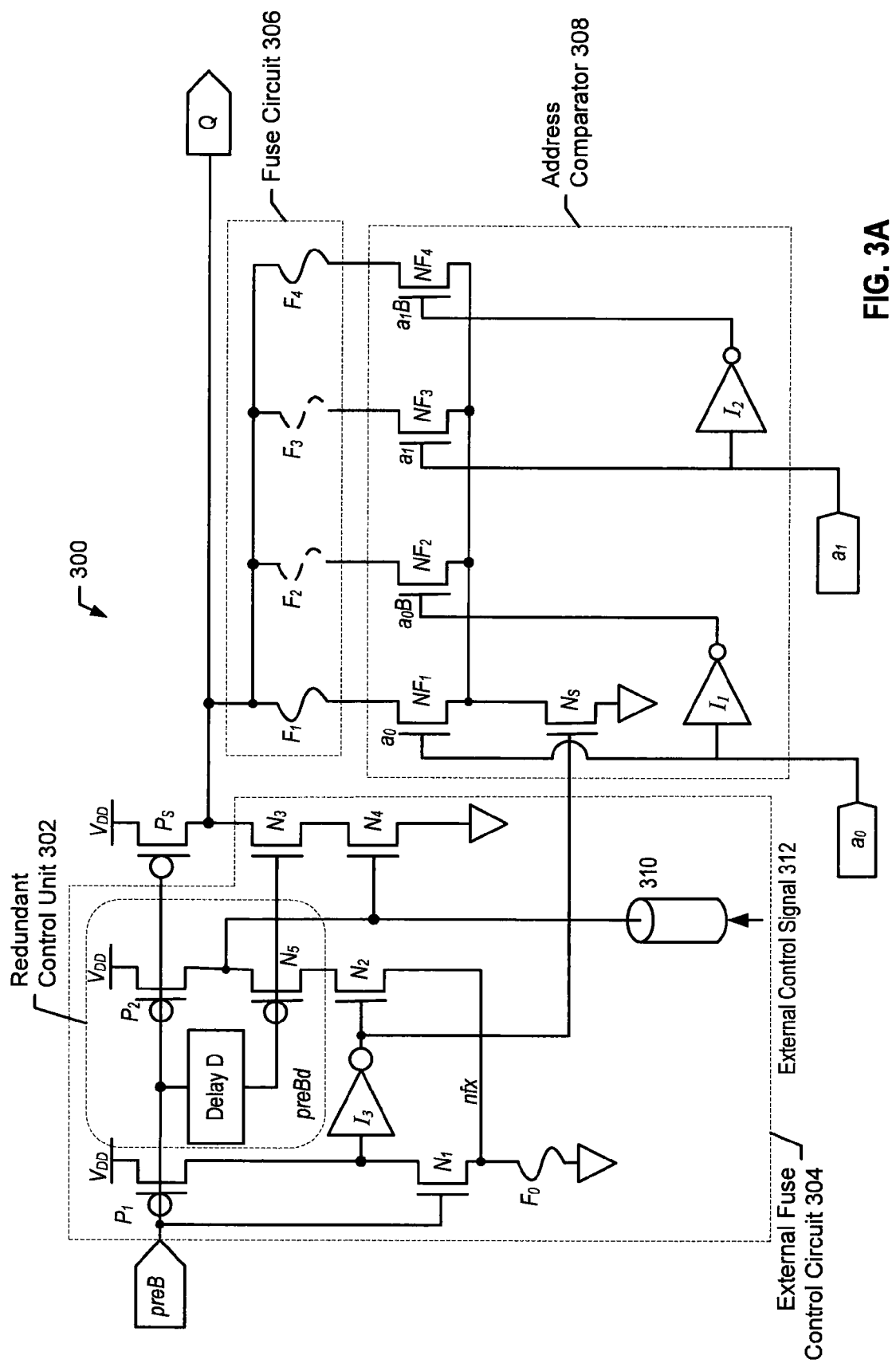
FIG. 3A illustrates a circuit diagram of a redundant controller depicted in FIGS. 1 and 2 according to an embodiment.

As shown in FIG. 3A, redundant controller 300 includes a redundant control unit 302, an external fuse control circuit 304, a fuse circuit 306, an address comparator 308, a receiving device 310, and an external control fuse $F_0$. Redundant control unit 302 generally corresponds to redundant row control units 232A and 232B. External fuse control circuit 304 generally corresponds to external fuse control circuits 230A and 230B.

Through terminals a0 and a1, redundant controller 300 receives an address signal from an external circuit attempting to access a redundant cell identified by the address data carried in the address signal. Redundant controller 300 also receives a clock signal through terminal preB to control sequence and timing of the operations of controller 300. Redundant controller 300 further receives an external control signal 312 through receiving device 310, which controls redundant control unit 302 and external fuse control circuit 304 to enable or disable address comparator 308. The clock signal and external control signal 312 are generated by an external control circuit, which will be described below.

Fuse circuit 306 includes a plurality of fuses $F_1$-$F_4$ for storing the address of a defective circuit cell, e.g., 104A, or a defective row/column, e.g., 204A or 204B. When redundant controller 300 is selected to activate a redundant cell to replace a defective cell in the regular cell array as described above in connection with FIGS. 1 and 2, the address of the defective cell is set and stored in fuse circuit 306 by selectively retaining or disconnecting fuses $F_1$-$F_4$. Fuse $F_1$-$F_4$ are shown for illustrative purpose. Fuse circuit 306 may have greater or fewer fuses depending on the number of bits in the address signal.

Address comparator 308 includes a plurality of transistors $NF_1$-$NF_4$, connected with fuses $F_1$-$F_4$, respectively, a bias transistor $N_s$, and inverters $I_1$ and $I_2$ respectively connected to gates of transistors $NF_2$ and $NF_4$. Comparator 308 receives the address signal through input terminals $a_0$ and $a_1$, compares the received address signal with the address stored in fuse circuit 306, and outputs a comparison result through an output terminal Q. The output on terminal Q indicates whether the received address signal matches the stored address.

External fuse control circuit 304 includes a plurality of transistors $P_1$ and $N_1$-$N_4$ and an inverter $I_3$. Redundant control unit 302 includes transistors $P_2$ and $N_5$ and a delay circuit D that the clock signal on terminal PreB to generate a delayed signal $PreB_d$. Receiving device 310 receives external control signal 312 for controlling external fuse control circuit 304 and redundant control unit 302. Receiving device 310 may be a through-silicon via (TSV), a fuse, a redistribution layer (RDL) connection, a micro bump, or other devices known in the art.

Depending on the status of external control fuse F0 and external control signal 312, external fuse control circuit 304 and redundant control unit 302 operate together to disable or enable address comparator 308. For example, when the external testing system described above selects redundant cell controller 300 to activate a redundant cell 106 (in FIG. 1) to replace a defective cell 104A in array 104, the external testing system retains external control fuse $F_0$ to indicate that redundant cell control circuit 300 is used. Furthermore, the external testing system sets and stores the address of defective cell 104A in fuse circuit 306 by selectively blowing fuses $F_1$-$F_4$ according to the address of defective cell 104A. For example, FIG. 3A shows that $F_1$ and $F_4$ remain connected and $F_2$ and $F_3$ are disconnected.

Figure 3B:
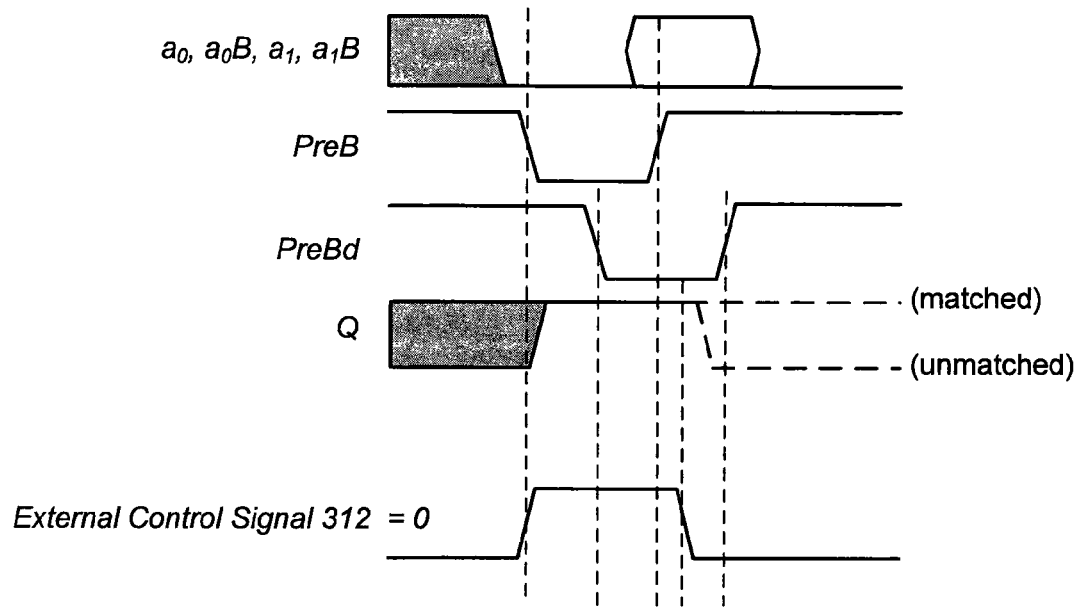
FIG. 3B depicts signal diagrams of the redundant controller in FIG. 3A when an external control signal is set to enable the redundant controller.

When external control signal 312 with a low voltage value, i.e., a logic "0," is received through receiving device 310 from an external control circuit, external fuse control circuit 304 and redundant cell control unit 302 enable address comparator 308 to generate the output signal on terminal Q. In this case, the output signal on terminal Q depends on whether the address signal matches the address stored by fuse circuit 306. FIG. 3B illustrates a signal diagram of redundant controller 300 when it is activated by external control signal 312 to select a redundant cell.

Figure 3C:
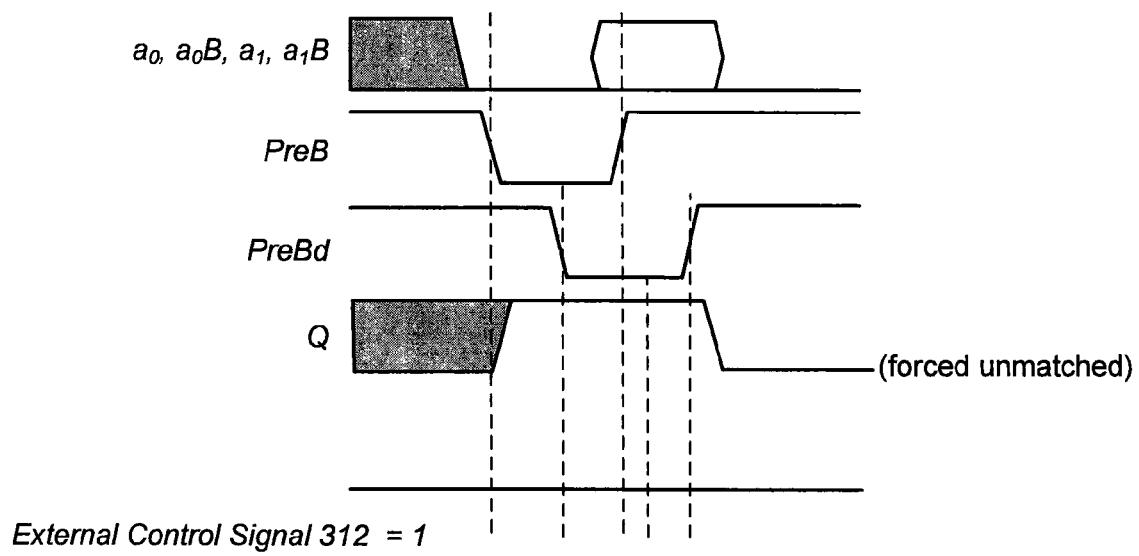
FIG. 3C depicts signal diagrams of the redundant controller in FIG. 3A when the external control signal is set to disable the redundant controller.

According to a further embodiment, when the redundant cell selected by redundant controller 300 becomes defective, redundant controller 300 is disabled so that the defective redundant cell could be replaced by an unused redundant cell. Specifically; in order to disable redundant controller 300, the external control circuit generates control signal 312 with a high voltage value, i.e., a logic "1," to control external fuse control circuit 304 and redundant control unit 302. In response, external fuse control circuit 304 and redundant control unit 302 force address comparator 308 to generate a low voltage, i.e., a logic "0," on terminal Q to reflect an "unmatched" result, regardless of whether the address signal matches the stored address. FIG. 3C illustrates a signal diagram illustrating when redundant controller 300 is disabled by external control signal 312 so that it can be replaced by another redundant control circuit.

Figure 4A:
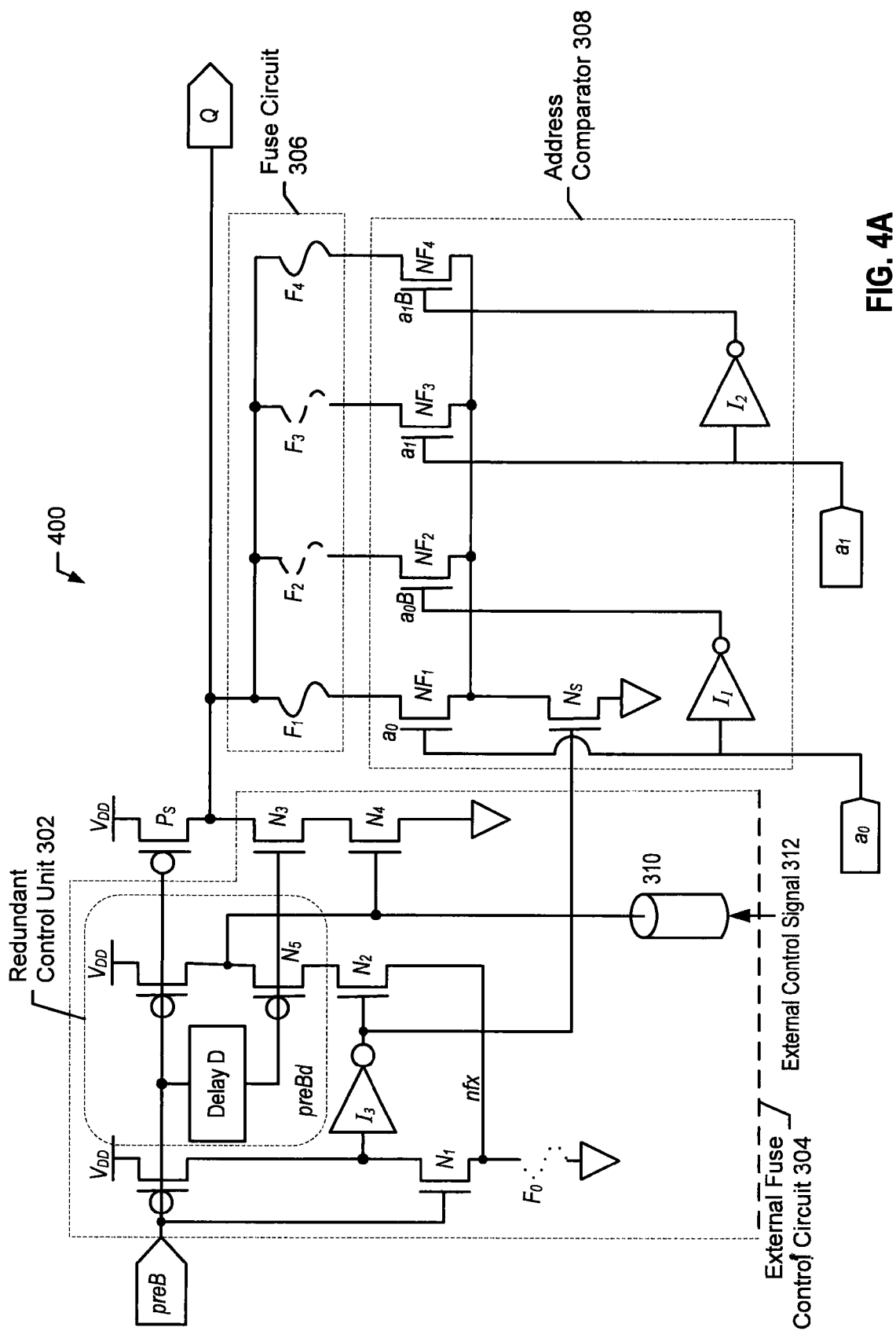
FIG. 4A illustrates a circuit diagram of the redundant controller depicted in FIGS. 1 and 2 according to another embodiment.
Figure 4B:
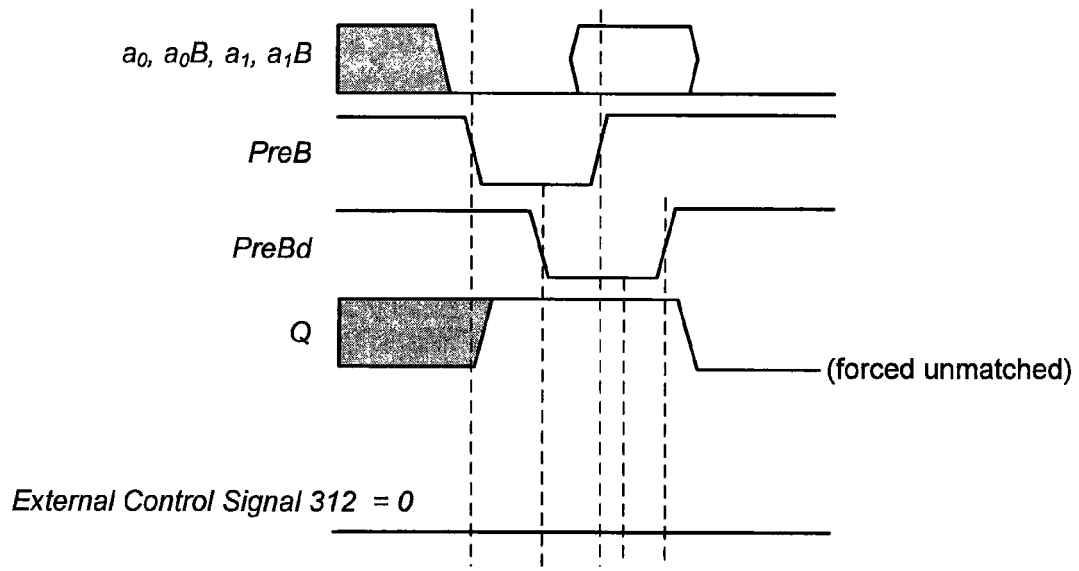
FIG. 4B depicts signal diagrams of the redundant controller in FIG. 4A when the external control signal is set to disable the redundant controller.

FIG. 4A illustrates an embodiment of another redundant controller 400. Redundant controller 400 generally corresponds to redundant controller 300 shown in FIG. 3A, except that fuse $F_0$ in redundant controller 400 is disconnected (indicated by the dotted line) to indicate that redundant controller 400 was not previously used to select a redundant cell to replace a defective cell in a regular cell array, e.g., array 104 in FIG. 1. Accordingly, when external control signal 312 with a low voltage value, i.e., a logic "0," is received through receiving device 310, external fuse control circuit 304 and redundant control unit 302 force address comparator 308 to output a low voltage value, i.e., a logic "0," in the output signal on terminal Q, indicating an "unmatched" result independent of the input address signals on terminals a0 and a1. FIG. 4B illustrates a signal diagram of redundant controller 400, when it is disabled by external control signal 312.

Figure 4C:
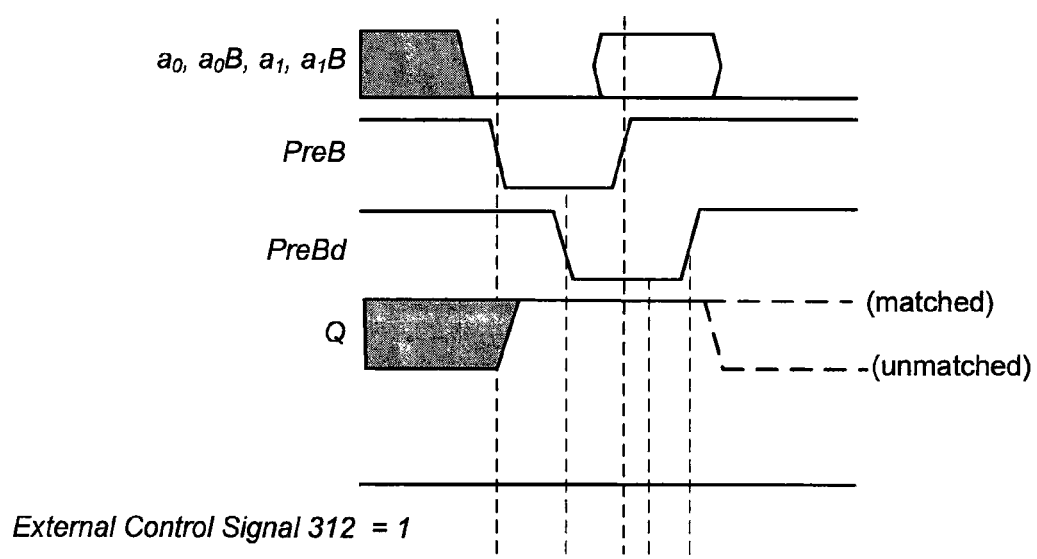
FIG. 4C depicts signal diagrams of the redundant controller in FIG. 4A when the external control signal is set to enable the redundant controller.

According to a further embodiment, redundant controller 400 shown in FIG. 4 may be enabled by external control signal 312 to select an unused redundant cell, e.g., 106B in FIG. 1, to replace a defective redundant cell, e.g., 106A in FIG. 1, which was previously activated to replace a defective cell in the regular cell array. Specifically, when external control signal 312 with a high voltage value, i.e., a logic "1," is received, external fuse control circuit 304 and redundant control unit 302 enable address comparator 308, which compares address signal (a0, a1) with the address stored in fuse circuit 306 and generates an output signal on terminal Q, indicating whether the address signal matches the pre-stored address. FIG. 4C illustrates a signal diagram of unused redundant controller 400, when it is enabled by external control signal 312.

According to a still further embodiment, the redundant controller described in FIGS. 1, 2, 3A-3C, and 4A-4C may be implemented in three-dimensional integrated circuits (3D ICs), such as 3D memory chips, to repair defective memory cells during or after fabrication. In 3D ICs, two or more layers of active electronic components are integrated both vertically and horizontally into a three-dimensional structure. For example, electronic components may be built on multiple dice, which are fabricated individually and then aligned and bonded together using a "die stacking" process. During the die stacking process, through-silicon vias (TSVs), fuses, RDL connections, or micro bumps can be created on the dice in vertical and horizontal directions through multiple layers to provide inter-layer connections.

Figure 5:
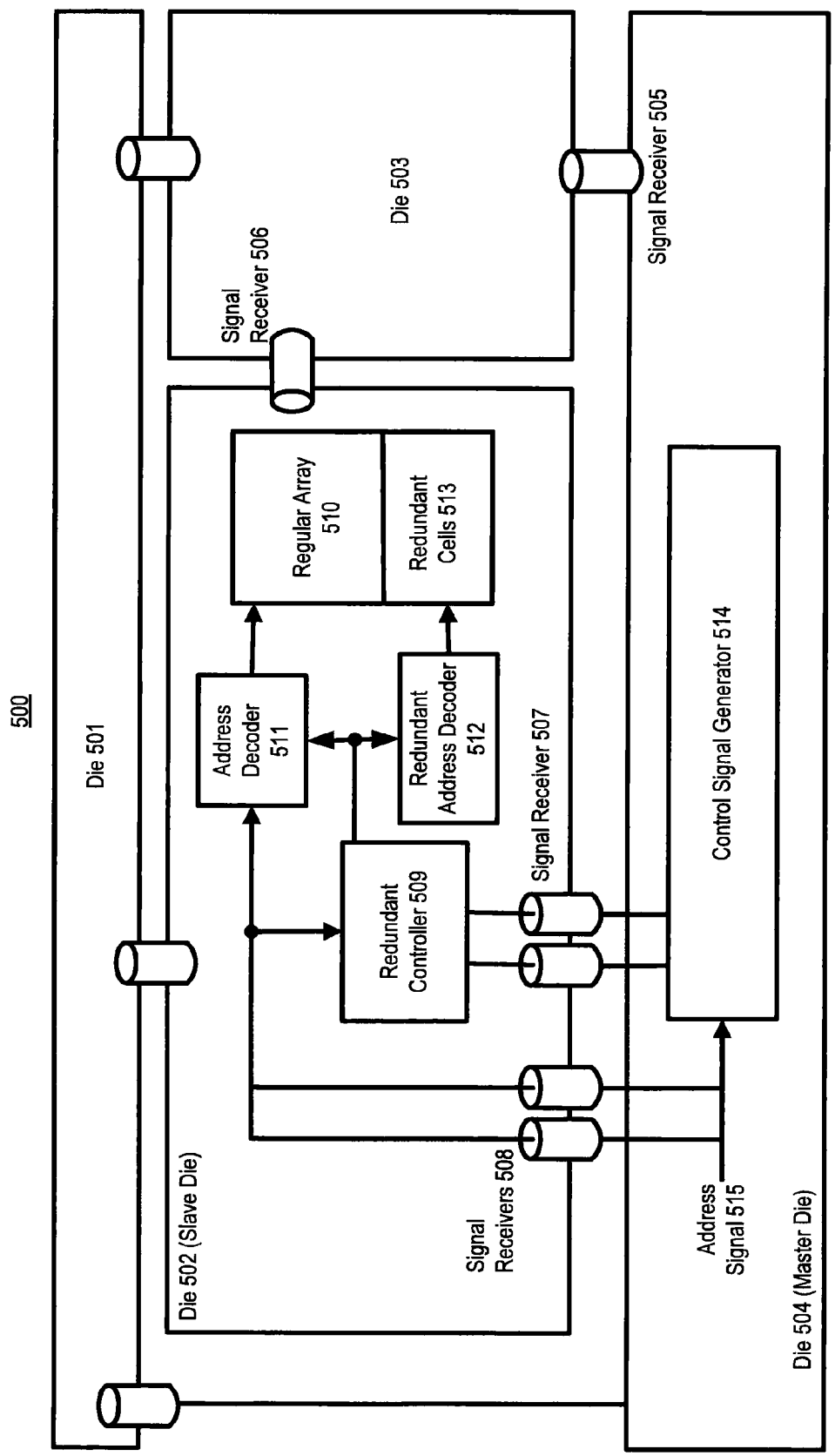
FIG. 5 illustrates a diagram of a three-dimensional integrated circuit comprising a master die and a slave die stacked together according to an embodiment.

FIG. 5 illustrates a 3D IC 500 with a three-layer structure according to one embodiment. Integrated circuit 500 includes four dice 501, 502, 503, and 504 integrated within the three-layer structure. Dice 501-504 may have different or similar internal structures. 3D IC 500 further includes a plurality of signal receivers, such as signal receivers 505, 506, 507, and 508, which provide communications among dice 501, 502, 503, and 504. The signal receivers may connect the dice within the same layer or across different layers.

As further shown in FIG. 5, die 502, designated as a slave die, includes circuit components similar to those described in FIGS. 1, 2, 3A, and 4A, such as a plurality of redundant controllers 509 (only one is shown for illustrative purpose), a regular cell array 510, an address decoder 511, a redundant address decoder 512, and a plurality of redundant cells 513. Redundant controllers 509 are similar to the redundant controllers described in FIGS. 3A and 4A.

Die 504, designated as a master die, includes a control signal generator 514, generally corresponding to the external control circuit described above in connections with FIGS. 1, 2, 3A, and 4A and configured to control the redundant controllers by means of the external control signals.

Signal receivers 507 and 508 are disposed between master die 504 and slave die 502 to transmit control signals and data, such as the external control signals used to control redundant controller 509 and an address signal 515.

During fabrication of slave die 502, circuit cells in cell array 510 may fail or become defective due to particle contamination, process abnormality, or other factors. After fabrication of slave die 502 and before the die stacking process, slave die 502 is subject to a variety of electrical tests to determine if its components function properly. The electrical tests may be carried out by a testing system similar to that described above. When defective circuit cells in regular cell array 510 are discovered, the testing system selects a redundant cell 513 and corresponding redundant controller 509 and stores the address of the defective circuit cell in the fuse circuit of selected controller 509 as discussed above in connection with FIGS. 3A and 4A.

In addition, the testing system configures control signal generator 514 to generate appropriate external control signals to activate redundant cells 513 and their associated redundant controller 509 to replace the defective cells in the regular cell array as described above with reference to FIGS. 1, 2, 3A-3C, and 4A-4C. Accordingly, control signal generator 514 generates and transmits appropriate control signals through signal receivers 507 to redundant controller 509 to activate corresponding redundant cell 513 to replace the defective circuit cell in regular array 510.

In order to activate selected redundant cells 513, the testing system retains the external control fuses, e.g., $F_0$ in FIG. 3A, in selected redundant controllers 509, indicating that these redundant controllers are used. On the other hand, the testing system blow or disconnects the external control fuses, e.g., $F_0$ in FIG. 4A, of all unselected redundant controllers 509, indicating that these redundant controllers are not used. As a results, the status of the external control fuse serves as a mark or an indicator for the used/unused status of the associated redundant controller 509. Furthermore, the testing system stores the addresses of defective cells in the fuse circuits of selected redundant controller 509.

Figure 6:
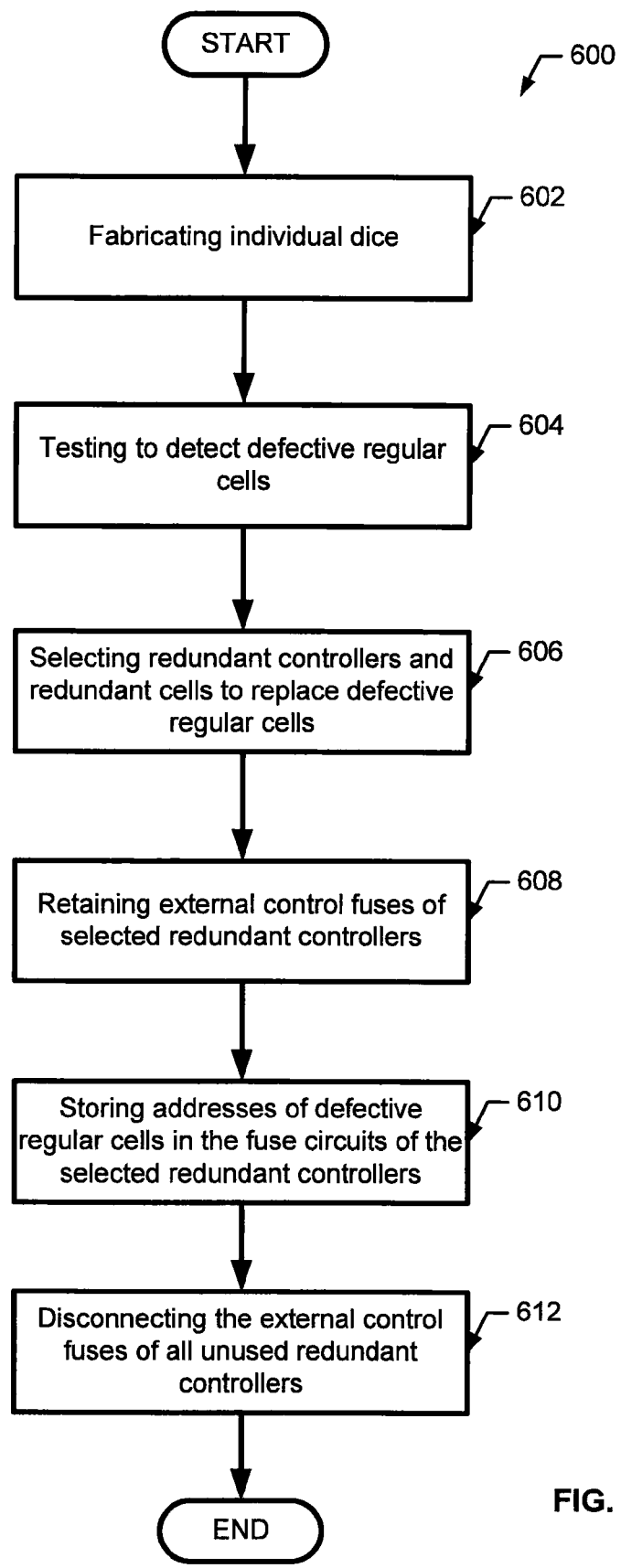
FIG. 6 illustrates a flowchart of a process for repairing an integrated circuit according to an embodiment.

FIG. 6 depicts a process 600 for repairing regular cell array 510 shown in FIG. 5 before the die stacking process, according to one embodiment. As shown in FIG. 6, slave die 502 is fabricated at step 602. At step 604, slave die 502 is tested by a testing system to determine whether any cells in regular cell array 510 are defective. The testing system identifies the defective cells and the addresses of the defective cells. At step 606, the testing system selects redundant cells 513 and their associated redundant controllers 506 replace the defective cells in the regular cell array. At step 608, the testing system retains the external control fuses of selected redundant controllers 509 to indicate that redundant controllers and the corresponding redundant cells have been used to replace the defective cells in the regular cell array. At step 610, the testing system sets and stores the addresses of the defective cells in the fuse circuits of selected redundant controllers 509 as described above in connections with FIGS. 3A, and 4A.

At step 612, the testing system disconnects the external control fuses of all unselected redundant controller 509 to indicate that these redundant controllers and their associated redundant cells are not used. The external control fuses may be disconnected by a variety of techniques. For example, when the external control fuses are laser fuses, the testing system may control a laser head to blow the external control fuses by laser means. Alternatively, when the external control fuses are metal fuses or polysilicon fuses, the testing system may generate a high electrical current or voltage to blow or disconnect the external control fuses by electrical means. The external control fuses may be programmable read-only devices or one-time programmable devices, which can be programmed by the testing system to disconnect from external circuits. Other embodiments of the external control fuses will be appreciated by those skilled in the art upon reading this disclosure.

Referring back to FIG. 5, after slave die 502 and master die 504 are fabricated and tested, all defective cells in regular cell array 510 are replaced with redundant cells according to the process described above. Thereafter, slave die 502, master die 504, and other dice 501 and 503 are stacked to form 3D IC 500. After the die stacking process, testing is performed again by the testing system on resulting 3D IC 500, because the die stacking process itself may cause defects in redundant cells 513 that were previously activated to replace the defective cells in the regular cell array. Upon discovering defects in the previously activated redundant cells, the testing system activates unused redundant cells 513 and their corresponding redundant controllers 509 to replace the defective redundant cells.

Figure 7:
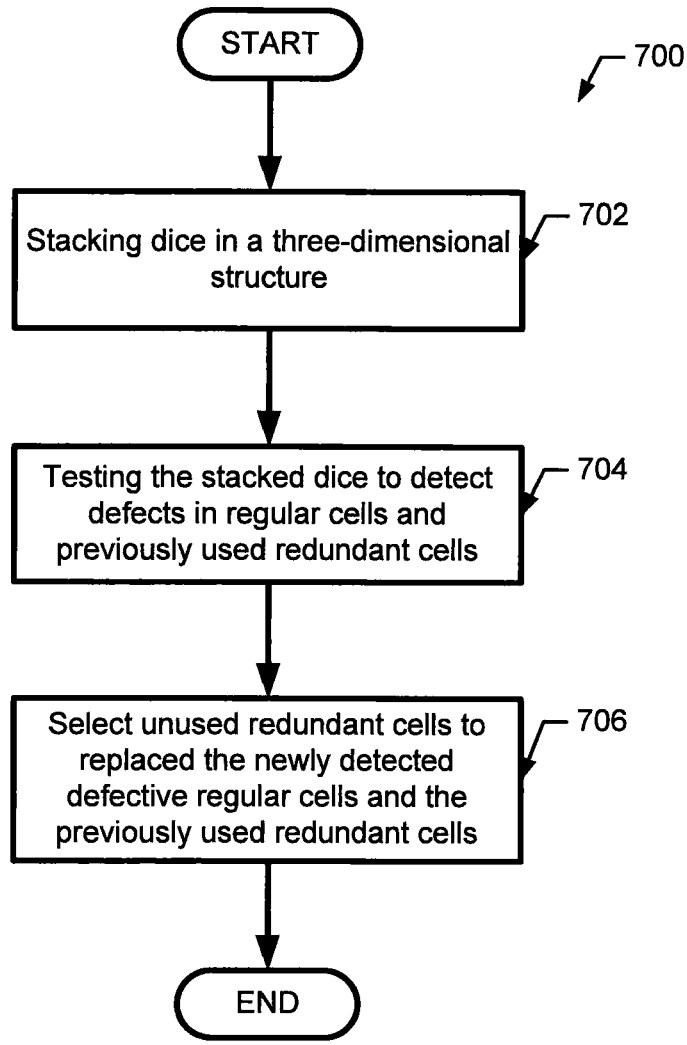
FIG. 7 illustrates a flowchart of a process for repairing an integrated circuit according to an embodiment.

FIG. 7 depicts a process 700 for repairing 3D IC 500 shown in FIG. 5 after the die stacking process, according to one embodiment. As shown in FIG. 7, at step 702, the die stacking process is performed to bond dice 501-504 within 3D IC 500. Proper connections are provided among the dice through receiving devices, such as devices 507-508, to transmit control signals and data.

At step 704, after the die stacking process, resulting 3D IC 500 is tested by the testing system to detect defects in the regular cells and the previously activated redundant cells. In order to distinguish previously used and unused redundant cells, the testing system checks the statuses of the external control fuses in redundant controllers 506 by reading signals from signal receivers 507. If the external control fuse is connected, the testing system determines that corresponding redundant controller 509 and redundant cell 513 have been used to replace a defective cell before the die stacking process. As a result, the used redundant cell cannot be reused. In addition, if such previously used redundant cell is defective, it is replaced by an unused redundant cell. Accordingly, the testing system identifies the addresses stored in the redundant controllers associated with these defective redundant cells.

At step 706, the testing system selects unused redundant cells that are free of defects to replace the defective redundant cells and the newly detected defective regular cells, which fail after the die stacking process. Here, again, the testing system checks the statuses of the external control fuses of the redundant controllers as describe above. Specifically, a disconnected external control fuse indicates that the associated redundant controller and the associated redundant cell are unused and, if they are free of defects, are available to replace the defective redundant cells. After selecting the unused redundant cells, the testing system sets and stores the addresses identified in step 704 in the fuse circuits of the unused redundant controllers.

When all of the defective cells in both regular array 510 and redundant cells 513 are properly repaired, the testing system configures control signal generator 514 in master die 504 to generate control signals and transmit them to slave die 502 so that the cells in regular array 510 and redundant cells 513 are properly accessed by external circuits. When address signal 515 is received from an external circuit attempting to access a circuit cell in regular array 510, control signal generator 514 generates and transmits control signals to redundant controllers 509 through signal receivers 507. The control signals disable or enable individual redundant controllers 509 as described above with reference to FIGS. 1, 2, 3A-3C, and 4A-4C. Control signals transmitted through signal receivers 507 are similar to external control signals 118A-118D in FIG. 1, external control signal 238 in FIG. 2, and external control signal 312 in FIGS. 3 and 4.

Figure 8:
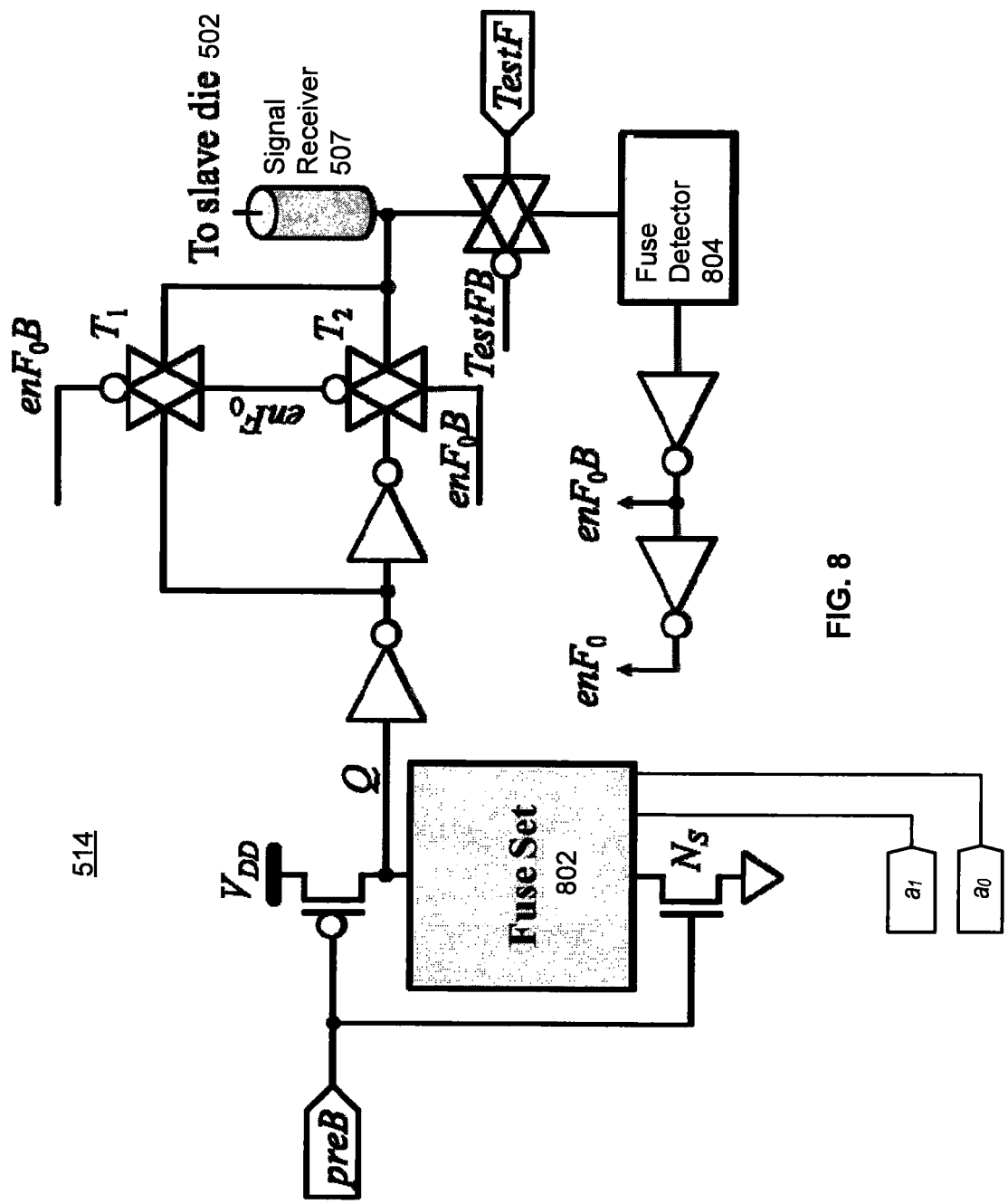
FIG. 8 illustrates a diagram of the control signal generator in FIG. 5.

FIG. 8 illustrates an exemplary diagram of control signal generator 514 shown in FIG. 5. Control signal generator 514 receives a clock signal through a terminal preB and an address signal through terminals $a_0$ and $a_1$ and generates a control signal, which is transmitted to slave die 502 of FIG. 5 through signal receiver 507.

Control signal generator 514 includes a fuse set 802 having a plurality of fuses similar to $NF_1$-$NF_4$ in FIG. 3A. Fuse set 802 may be configured by a testing system described above to store the address of a defective cell in regular array 510 of FIG. 5. During an electrical testing, the testing system discovers a defective cell as described above and stores its address in fuse set 802 by selectively blowing or disconnecting fuses therein. Accordingly, if address data carried in the address signal received through terminals $a_0$ and $a_1$ match the address stored in fuse set 802, control signal generator 514 generates the control signal and transmits the same to slave die 502 through signal receiver 507.

Control signal generator 514 further includes a fuse detector 804, which detects the status of an individual external control fuse, such as fuse $F_o$ in FIG. 3A, and controls the logic of the control signal output to slave die 502 of FIG. 5. For example, fuse detector 804 is a programmable device or a firmware device, which is configured by the testing system to provide the logic described herein. In particular, fuse detector 84 receives an indication signal from a redundant controller, e.g., redundant controller 509 of FIG. 5, through receiver 507. Fuse detector 804 then determines the status of the corresponding external control fuse based on this indication signal. For example, if the indication signal has a value of logic "1," indicating that the corresponding external control fuse is not blown or not disconnected, fuse detector 804 may output a logic "1." Otherwise, fuse detector 804 may output a logic "0," indicating that the corresponding external control fuse is blown or disconnected.

Furthermore, signals received on terminals preB and TestF from the testing system may set control signal generator 514 to a testing mode or a signal generating mode. In the testing mode, signals $enF_0$ and $enF_0B$ generated based on the output of fuse detector 804 are used by the testing system to determine whether an external control fuse in a redundant controller is blown or not. When control signal generator 514 is set to the signal generating mode, signals $enF_0$ and $enF_0B$ are used by control signal generator 514 to control the logic of the control signal output to slave die 502.

If, based on the signals from fuse detector 804, the testing system determines the external control fuse is connected, indicating that the corresponding redundant cell was previously selected to replace a defective cell in the regular array, and if the testing system determines the corresponding redundant cell is defective, the testing system configures fuse detector 804 to reverse the logic of the control signal output to slave die 502, thereby disabling the redundant controller corresponding to the defective redundant cell.

Other embodiments of the invention will be apparent to those skilled in the art from consideration of the specification and practice of the embodiments disclosed herein. The scope of the invention is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

What is claimed is:

1. A method for repairing an integrated circuit, comprising:
fabricating a first circuit, the first circuit including a plurality of regular units and a plurality of redundant units, each of the regular units being identified by an address;
performing a first test on the first circuit to determine if a defective regular unit is present;

activating, if the defective regular unit is present, at least a first redundant unit to replace the defective regular unit, the first redundant unit being identified by an address of the defective regular unit;

performing, if the at least first redundant unit is present, a second test on the first circuit to determine if the first redundant unit is defective; and activating at least a second redundant unit to replace the defective first redundant unit, the second redundant unit being identified by the address of the defective regular unit.

2. The method of claim 1, further comprising:
integrating the first circuit in a second circuit after performing the first test and before performing the second test, the second circuit including at least a master circuit and a slave circuit, and the first circuit being disposed within the slave circuit.

3. The method of claim 2, further comprising:
marking the first redundant unit as used and the second redundant unit as unused before the integration of the first circuit into the second circuit; and disposing a receiving device in the first circuit to receive an external control signal to control the first redundant unit and the second redundant unit.

4. The method of claim 3, further comprising receiving, by the slave circuit through the receiving device, the external control signal from the master circuit.

5. The method of claim 3, further comprising providing one or more through-silicon vias as the receiving device.

6. The method of claim 3, further comprising:
disabling the defective first redundant unit in response to the external control signal; and
enabling the second redundant unit in response to the external control signal.

7. The method of claim 3, wherein each redundant unit has a corresponding redundant unit controller including a fuse circuit and an address comparator, and
the activating of the first redundant unit to replace the defective regular unit comprises:
storing the address of the defective regular unit in the fuse circuit of the redundant unit controller corresponding to the first redundant unit;
enabling the address comparator of the redundant unit controller corresponding to the first redundant unit in response to the external control signal;
receiving an address signal;
comparing, by the address comparator of the redundant unit controller corresponding to the first redundant unit, the received address signal with the stored address; and
outputting a result indicating whether the address signal matches the stored address.

8. The method of claim 7, wherein the activating of the second redundant unit to replace the defective first redundant unit comprises:
storing in the fuse circuit of the redundant unit controller corresponding to the second redundant unit the address of the defective regular unit that is replaced by the defective first redundant unit;
disabling the address comparator of the redundant unit controller corresponding to the defective first redundant unit in response to the external control signal;
enabling the address comparator of the redundant unit controller corresponding to the second redundant unit in response to the external control signal;
receiving the address signal;
comparing, by the address comparator of the redundant unit controller corresponding to the second redundant unit, the received address signal with the address stored in the fuse circuit of the redundant unit controller corresponding to the second redundant unit; and
outputting a result indicating whether the address signal matches the stored address.

9. The method of claim 2, further comprising:
disposing a fuse element in each of the first and second redundant units; and
marking the first redundant unit and the second redundant unit as used or unused using the fuse elements.

10. The method of claim 9, further comprising marking the first redundant unit as used by maintaining as connected the fuse element of the first redundant unit.

11. The method of claim 9, further comprising marking the second redundant unit as unused by disconnecting the fuse element of the second redundant unit.

12. The method of claim 9, further comprising determining whether the fuse elements of the redundant units are disconnected or connected.

13. The method of claim 9, further comprising determining whether a redundant unit is the first redundant unit or the second redundant unit by checking whether the fuse element of the redundant unit is connected or disconnected.

14. The method of claim 13, further comprising:
if the fuse element is connected, determining that the redundant unit is the first redundant unit; and
if the fuse element is disconnected, determining that the redundant unit is the second redundant unit.

15. The method of claim 1, further comprising:
determining, in the second test, whether an additional defective regular unit is present in the plurality of regular units; and
activating, if the additional defective regular unit is present, at least a third redundant unit to replace the additional defective regular unit.

16. The method of claim 1, wherein the plurality of regular units includes a plurality of circuit cells, and
the performing of the first test on the first circuit to determine if the defective regular unit is present further comprises:
determining if a circuit cell in the regular units is defective.

17. The method of claim 16, wherein the plurality of circuit cells are arranged in a one-dimensional array, and each regular unit includes one of the circuit cells.

18. The method of claim 17, wherein the plurality of circuit cells are arranged in a two-dimensional array, and each regular unit includes one of a row or a column of the circuit cells.

19. An apparatus for repairing an integrated circuit, comprising:
a plurality of redundant control circuits, each redundant control circuit being associated with a redundant unit, each redundant control circuit including:
a receiving device configured to receive an external control signal;
a fuse element configured to indicate whether the redundant unit associated with the redundant control circuit is available to replace another redundant unit that was previously activated to repair the integrated circuit; and
a redundant controller configured to select and activate the associated redundant unit in response to the external control signal to replace the previously activated redundant unit, if the associated redundant cell is available to replace the previously activated redundant unit, the associated redundant unit and the previously activated redundant unit being identified by a same address.

20. The apparatus of claim 19, wherein the receiving device includes a through-silicon via.

21. The apparatus of claim 19, wherein:
the integrated circuit has a three-dimensional structure and includes a master circuit and a slave circuit bonded by a die stacking process;
the plurality of redundant control circuits are disposed within the slave circuit; and
the receiving device receives the external control signal from the master circuit.

22. The apparatus of claim 21, wherein,
if the fuse element is connected, the associated redundant unit was previously activated to repair the integrated circuit; and
the redundant controller is further configured to disable the associated redundant unit in response to the external control signal.

23. The apparatus of claim 19, wherein:
the associated redundant unit is available to replace the previously activated redundant unit if the fuse element is disconnected; and
the associated redundant unit is unavailable to replace the previously activated redundant unit if the fuse element is connected.

24. The apparatus of claim 19, wherein each redundant control circuit further comprises:
a fuse circuit configured to store an address of a unit that is replaced by the associated redundant unit;
an address comparator configured to receive an address signal, compare the address signal with the address stored in the fuse circuit, and generate an output indicating a comparison result; and
an address decoder configured to access the associated redundant unit in accordance with the comparison result.

25. The method of claim 19, wherein the integrated circuit includes a plurality of cells arranged in a one-dimensional array, and each of the redundant unit and the previously activated redundant unit includes a redundant cell.

26. The method of claim 19, wherein the integrated circuit includes a plurality of cells arranged in a two-dimensional array, and each of the redundant unit and the previously activated redundant unit includes one of a row or a column of redundant cells.

* * * * *